(12) United States Patent
Wang et al.

(10) Patent No.: US 9,972,665 B2
(45) Date of Patent: May 15, 2018

(54) ORGANIC LIGHT EMITTING DIODE DISPLAY PANEL, FABRICATION METHOD THEREOF, AND DISPLAY DEVICE

(71) Applicant: BOE TECHNOLOGY GROUP CO., LTD., Beijing (CN)

(72) Inventors: Huifeng Wang, Beijing (CN); Ze Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days. days.

(21) Appl. No.: 15/032,866

(22) PCT Filed: Jul. 22, 2015

(86) PCT No.: PCT/CN2015/084741
§ 371 (c)(1),
(2) Date: Apr. 28, 2016

(87) PCT Pub. No.: WO2016/165233
PCT Pub. Date: Oct. 20, 2016

(65) Prior Publication Data
US 2017/0104042 A1    Apr. 13, 2017

(30) Foreign Application Priority Data

Apr. 16, 2015  (CN) .......................... 2015 1 0181465

(51) Int. Cl.
*H01L 29/08*   (2006.01)
*H01L 21/00*   (2006.01)
(Continued)

(52) U.S. Cl.
CPC ...... *H01L 27/3246* (2013.01); *H01L 27/3283* (2013.01); *H01L 51/56* (2013.01);
(Continued)

(58) Field of Classification Search
CPC . H01L 27/3246; H01L 51/56; H01L 27/3283; H01L 2227/323; H01L 51/0545;
(Continued)

(56) References Cited

U.S. PATENT DOCUMENTS 7,427,833 B2  9/2008  Fish et al.
7,754,275 B2  7/2010  Mitsuhashi et al.
(Continued)

FOREIGN PATENT DOCUMENTS

CN    1799082 A    7/2006
CN    101076211 A  11/2007
(Continued)

OTHER PUBLICATIONS

International Search Report of PCT/CN2015/084741 in Chinese, dated Jan. 27, 2016 with English translation.
(Continued)

*Primary Examiner* — Thinh T Nguyen
(74) *Attorney, Agent, or Firm* — Collard & Roe, P.C.

(57) ABSTRACT

An organic light emitting diode display panel and a fabrication method thereof, a display device are provided, and the method includes: forming an anode layer (41) a light-emitting layer and a cathode layer on a substrate (40) and the method further includes: depositing a first pixel defining layer thin film (51) on the anode layer (41); depositing a second pixel defining layer thin film on the first pixel defining layer thin film (51), and forming a second pixel defining layer (61) by patterning the second pixel defining layer thin film through patterning process; and forming a first pixel defining layer (71) through dry etching and removing the first pixel defining layer thin film that is exposed; wherein the first pixel defining layer (71) has a lyophilic property and the second pixel defining layer (61) has a lyophobic property. A double-layer pixel defining layer prepared in the method is capable of reducing a mask plate,
(Continued)

reducing the production cost, and improving the production efficiency.

15 Claims, 3 Drawing Sheets

(51) Int. Cl.
*H01L 27/32* (2006.01)
*H01L 51/56* (2006.01)
H01L 51/05 (2006.01)
H01L 27/12 (2006.01)
H01L 51/50 (2006.01)

(52) U.S. Cl.
CPC .......... *H01L 27/12* (2013.01); *H01L 51/0541* (2013.01); *H01L 51/5012* (2013.01); *H01L 2227/323* (2013.01)

(58) Field of Classification Search
CPC ............. H01L 51/0036; H01L 51/0541; H01L 51/5012; H01L 21/775; H01L 27/12; H01L 29/4908
USPC ........ 257/40, 59, 72, 79, E51.001, E51.003; 438/82, 99, 48, 128
See application file for complete search history.

(56) References Cited

U.S. PATENT DOCUMENTS

| | | | |
|---|---|---|---|
| 8,581,273 B2* | 11/2013 | Takei | ................. H01L 27/3216 257/40 |
| 8,809,866 B2 | 8/2014 | Iwasaki et al. | |
| 2006/0197086 A1* | 9/2006 | Rhee | ................... H01L 27/3246 257/59 |
| 2007/0170429 A1* | 7/2007 | Miyazawa | .......... H01L 51/5262 257/59 |
| 2007/0269621 A1* | 11/2007 | Mitsuhashi | ......... H01L 27/3246 428/34.1 |
| 2012/0305952 A1* | 12/2012 | Takei | .................. H01L 27/3216 257/89 |

FOREIGN PATENT DOCUMENTS

| | | |
|---|---|---|
| CN | 103579290 A | 2/2014 |
| CN | 104752490 A | 7/2015 |
| TW | 201248966 A | 12/2012 |

OTHER PUBLICATIONS

Notice of Transmittal of the International Search Report of PCT/CN2015/084741 in Chinese, dated Jan. 27, 2016.
Written Opinion of the International Searching Authority of PCT/CN2015/084741 in Chinese, dated Jan. 27, 2016 with English translation.
Chinese Office Action in Chinese Application No. 201510181465.6 dated Dec. 9, 2015 with English translation.
Patent Certificate for Chinese Application No. 201510181465.6 issued Apr. 6, 2016.

* cited by examiner

ORGANIC LIGHT EMITTING DIODE DISPLAY PANEL, FABRICATION METHOD THEREOF, AND DISPLAY DEVICE

CROSS REFERENCE TO RELATED APPLICATIONS

This application is the National Stage of PCT/CN2015/084741 filed on Jul. 22, 2015, which claims priority under 35 U.S.C. § 119 of Chinese Application No. 201510181465.6 filed on Apr. 16, 2015, the disclosure of which is incorporated by reference.

TECHNICAL FIELD

Embodiments of the present disclosure relate to an organic light emitting diode display panel, a fabrication method thereof, and a display device.

BACKGROUND

Compared with liquid crystal displays (LCDs), organic light emitting diode (OLED) devices have the advantages such as self light-emitting, fast response, wide viewing angle, high brightness, colorful color, thin profile and so on, and the organic light emitting diode (OLED) devices are considered as the next generation of display technology.

The film forming methods for OLED mainly include an evaporation process and a solution process. The evaporation process is more mature in small size application, at present, the technology has been applied in mass production. In the solution process, the OLED film formation methods mainly are ink jet printing, nozzle coating, spin coating, silk screen printing, etc, wherein the inkjet printing technology is considered to be an important way for mass production of large size OLED because of its high material utilization ratio and capable of realizing large size production.

SUMMARY

Embodiments of the present disclosure provide an organic light emitting diode display panel, a fabrication method thereof, and a display device, for reducing a mask plate, reducing production cost and improving production efficiency.

One embodiment of the present disclosure provides a method for preparing an organic light emitting diode display panel, and the method includes: forming an anode layer, a light-emitting layer and a cathode layer on a substrate and the method further includes: depositing a first pixel defining layer thin film on the anode layer; depositing a second pixel defining layer thin film on the first pixel defining layer thin film, and forming a second pixel defining layer by patterning the second pixel defining layer thin film through patterning process; and forming a first pixel defining layer through dry etching and removing the first pixel defining layer thin film that is exposed; wherein the first pixel defining layer has a lyophilic property and the second pixel defining layer has a lyophobic property.

For example, the second pixel defining layer thin film for forming the second pixel defining layer is made of a material which is a resin having no fluorine, and the formed second pixel defining layer is subjected to a fluoridization treatment to make the second pixel defining layer has a lyophobic property.

For example, a gas used in the fluoridization treatment for the formed second pixel defining layer is $C_xF_y$ gas.

For example, the gas used in the fluoridization treatment for the formed second pixel defining layer is tetrafluoromethane.

For example, the second pixel defining layer thin film for forming the second pixel defining layer is made of a material which is selected from the group consisting of polyimide, acrylic resin or organic silicon.

For example, the etching gas used in the dry etching is tetrafluoromethane and oxygen.

For example, the first pixel defining layer thin film for forming the first pixel defining layer is made of a material which is selected from the group consisting of silicon oxide or silicon nitride.

For example, a cross section of the second pixel defining layer is a regular trapezoid.

Another embodiment of the present disclosure further provides an organic light emitting diode display panel which is the organic light emitting diode display panel prepared by the above-mentioned methods.

Another embodiment of the present disclosure further provides a display device, and the display device comprises the above-mentioned organic light emitting diode display panel.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
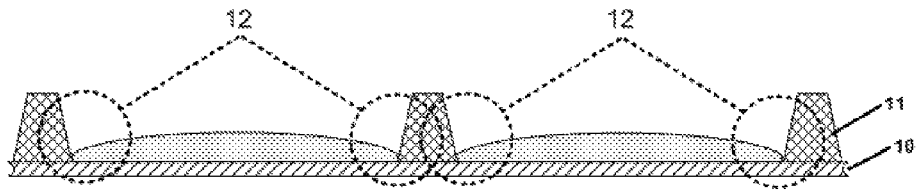
FIG. 1 is a schematic diagram of a structure of a single-layer pixel defining layer of a prior art.

As shown in FIG. 1, in a technology of preparing an OLED, a pixel defining layer (PDL) 11 should be previously formed on an electrode layer 10 of a substrate in the ink-jet printing process to define the ink droplet flowed into a specific sub pixel area accurately. PDL 11 requires a lyophobic type material having a smaller surface energy, so as to ensure that the ink droplets spread in the pixel without overflowing. But in the contact points of ink droplets and PDL 11, because the surface energy difference between the ink droplets and PDL 11, large slope angle of the PDL, and the drying behavior of the ink droplet itself, a non-uniform thin film with thin edge and thick middle is like to be formed after drying the ink droplet, the non-uniform area 12 shown in the FIG., namely a coffee ring effect. Direct defects caused by this type of coffee ring effect are: 1. leakage due to the hole in the edge of the pixel, and 2. a non-uniform brightness in the pixel.

Figure 2:
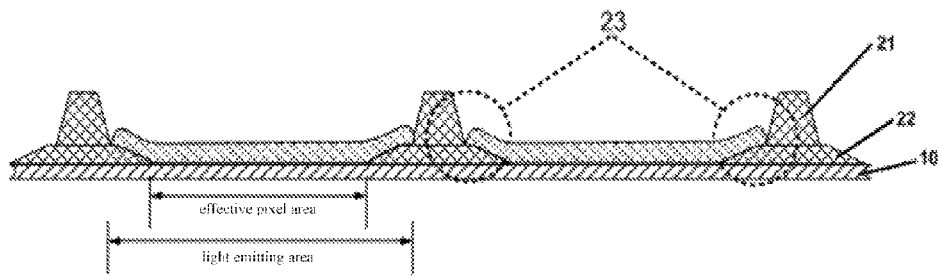
FIG. 2 is a schematic diagram of a structure of a double-layer pixel defining layer of a prior art.

In order to avoid the defects caused by the coffee ring effect of the pixel, generally a double-layer PDL structure is used to avoid the defects. As shown in FIG. 2, the first PDL 21 still uses a lyophobic material having smaller surface energy, the second layer PDL 22 is designed below the first layer PDL 21, and the second layer PDL 22 is made of an inorganic material having larger surface energy. The fabrication process of the double-layer PDL structure includes: the second layer of PDL22 is made through the first mask plate, and then the first layer PDL21 is made through the second mask plate. The double-layer PDL design can effectively avoid the holes in the edge of the pixels, and due to its light emitting area of the light emitting region is larger than the area of the effective pixel area, part of the light-emitting area 23 with non-uniform edge thickness does not emit light, thereby the non-uniform light-emitting is reduced in the pixel. However, compared with the single-layer PDL design, the double-layer PDL design adds a mask plate, which increases the risk of production fault, and accordingly the cost of production is increased.

In summary, the single-layer PDL structure will cause the problems of leakage in pixel edge and the uneven brightness in pixel; in the preparation of the double-layer PDL structure, two mask plates are needed, and the production cost is high; both the two methods have some problems.

Embodiments of the present disclosure provide an organic light emitting diode display panel, a fabrication method thereof, and a display device, for reducing a mask plate to prepare a double-layer PDL, reducing production cost and improving production efficiency.

The fabrication method of an organic light emitting diode display panel provided by the embodiment of the present disclosure will be described in detail below with the accompanying drawings.

Figure 3:
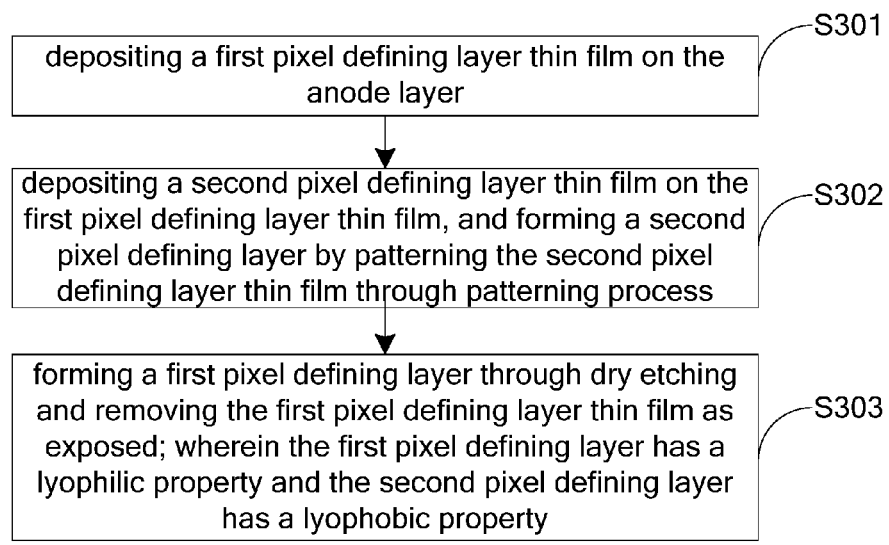
FIG. 3 is a flow diagram of a fabrication method of an organic light emitting diode display panel provided by the embodiment of the present disclosure.

As shown in FIG. 3, an embodiment of the present disclosure provides a method for preparing an organic light emitting diode display panel, and the method includes forming an anode layer, a light-emitting layer and a cathode layer on a substrate, and the method further includes the following steps S301, S302 and S303.

S301: depositing a first pixel defining layer thin film on the anode layer;

S302: depositing a second pixel defining layer thin film on the first pixel defining layer thin film, and forming a second pixel defining layer by patterning the second pixel defining layer thin film through patterning process; and S303: forming a first pixel defining layer through dry etching and removing the first pixel defining layer thin film that is exposed; wherein the first pixel defining layer has a lyophilic property and the second pixel defining layer has a lyophobic property. The fabrication method of an organic light emitting diode display panel provided by the embodiment of the present disclosure will be described in detail below with the accompanying drawings.

Figure 4:
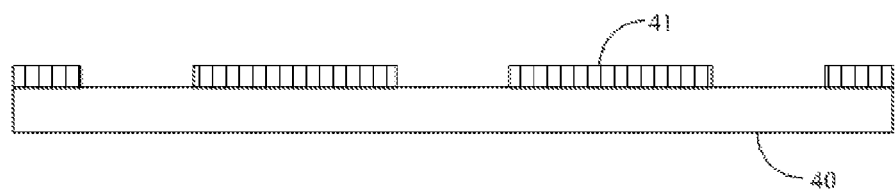
FIG. 4-FIG. 8 are schematic structural diagrams in different stages of a process for preparing an organic light emitting diode display panel provided by the embodiment of the present disclosure.

As shown in FIG. 4, firstly, a first electrode layer is formed on a substrate 40, and the first electrode layer usually is an anode layer 41. Because the OLED devices are divided into two types of bottom emitting and top emitting, a bottom emitting device structure is formed by setting a transparent anode structure and a reflection cathode structure, and conversely, a top emitting device structure is formed by setting a transparent cathode structure and a reflection anode structure. Therefore, according to the device structural difference, the choice of the material of anode layer 41 is also different. The anode layer 41 is usually made of transparent or translucent material with high work function such as indium tin oxide (ITO), silver (Ag), nickel oxide (NiO), aluminum (Al), graphene and the like. An anode layer 41 is formed on a substrate 40 through a magnetron sputtering method in the embodiment of the present disclosure; of course, in the actual production process, the anode layer 41 can also be made in other methods, the existing technology can be used in the production process of the anode layer 41, and detailed descriptions will be omitted herein.

Figure 5:
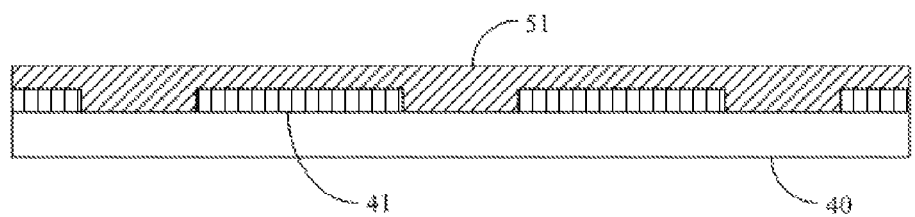

As shown in FIG. 5, then depositing a first pixel defining layer thin film 51 on the anode layer 41, for example, depositing a first pixel defining layer thin film 51 on the anode layer 41 through the method of plasma enhanced chemical vapor deposition (PECVD) in an embodiment of the present disclosure. Of course, in the actual production process, the first pixel defining layer thin film 51 can also be deposited in other film forming method, the film forming method is not limited in the embodiment of the present disclosure. The first pixel defining layer thin film 51 in the embodiment of the present disclosure is made of silicon oxide ($SiO_2$), silicon nitride (SiN), ceramic powder and metal oxide, etc. For example, the first pixel defining layer thin film 51 in the embodiment of the present disclosure is made of $SiO_2$ or SiN.

Figure 6:
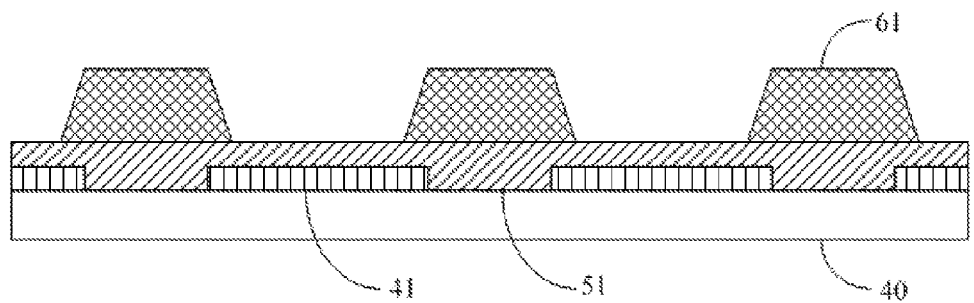

As shown in FIG. 6, then a second pixel defining layer thin film is disposed on the first pixel defining layer thin film 51, and a second pixel defining layer 61 is formed by patterning the second pixel defining layer thin film through patterning process. The patterning process in the embodiment of the present disclosure includes: a part or whole process of coating a photoresist, exposing, developing, etching and removing of the photoresist. For example, coating a photoresist on the second pixel defining layer thin film as deposited in the embodiment of the present disclosure, then exposing and developing the coated photoresist to remain the photoresist in the position where the second pixel defining layer is to be formed, then etching to remove the second pixel defining layer film that is exposed, finally removing the remaining photoresist to form the second pixel defining layer 61. Of course, in the actual production process, the method for preparing the second pixel defining layer 61 may also be: depositing a second pixel defining layer thin film on the first pixel defining layer thin film 51, the properties of the second pixel defining layer thin film as deposited are the same as the properties of the photoresist, then exposing and developing the second pixel defining layer thin film as deposited to remain the second pixel defining layer thin film in the position where the second pixel defining layer is to be formed, the second pixel defining layer film as remained is the second pixel defining layer 61 in the embodiment of the present disclosure.

For example, a cross section of the second pixel defining layer 61 in the embodiment of the present disclosure is a regular trapezoid. Of course, the cross section of the second pixel defining layer 61 in the embodiment of the present disclosure can also be other shape, the cross section shape of the second pixel defining layer 61 is not limited in the embodiment of the present disclosure. For example, in order to make the cross section of the second pixel defining layer 61 in the embodiment of the present disclosure into a regular trapezoid, and it can be achieved through precisely adjusting the baking temperature before exposing, the exposure energy in the process of exposing and the distance between the mask plate and the substrate, the baking temperature after exposing. The height of the second pixel defining layer 61 prepared in the embodiment of the present disclosure is from 0.1 µm to 100 µm, or the height of the second pixel defining layer 61 may be from 1 µm to 5 µm.

Figure 7:
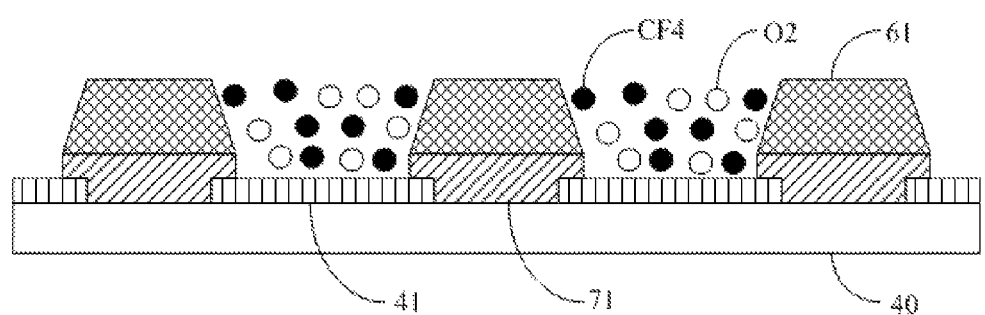

As shown in FIG. 7, then a first pixel defining layer 71 is formed through dry etching and removing the first pixel defining layer thin film that is exposed; the first pixel defining layer 71 has a lyophilic property and the second pixel defining layer 61 has a lyophobic property. For example, in the case of dry etching the first pixel defining layer thin film that is exposed in the embodiment of the present disclosure, the etching gas used in the dry etching is tetrafluoromethane ($CF_4$) and oxygen ($O_2$). In the process of etching, the area of the first pixel defining layer film not covered by the second pixel defining layer 61 is etched by $CF_4$ and $O_2$, and the area covered by the second pixel defining layer 61 is not etched, and the first pixel layer 71 is formed after the etching. Besides, in the process of dry etching, at the time of etching the first pixel defining layer film by $CF_4$ and $O_2$, also causing a certain thinning of the second pixel defining layer, therefore in the actual operation process, the thickness of the second pixel defining layer film as deposited requires to be greater than the target thickness of the second pixel defining layer. The principle of dry etching is known, and detailed descriptions will be omitted herein.

For example, the second pixel defining layer thin film for forming the second pixel defining layer 61 is made of a material which is a resin having no fluorine. For example, the second pixel defining layer thin film for forming the second pixel defining layer 61 is made of polyimide, acrylic resin, organic silicon, or materials containing carbon hydrogen bonds, hydroxyl groups and amino groups.

In the case that the second pixel defining layer thin film 61 in the embodiment of the present disclosure is made of a material which is a resin having no fluorine, the properties of the second pixel defining layer 61 shown in FIG. 7 has a lyophilic property and the second pixel defining layer to be prepared in the embodiment of the present disclosure is required to have a lyophobic property. Therefore, in the case that the second pixel defining layer thin film 61 in the embodiment of the present disclosure is made of a material which is a resin having no fluorine, the first pixel defining layer film that is exposed is removed by dry etching, after forming the first pixel defining layer, the method further includes: subjecting the second pixel defining layer to a fluoride treatment to make the second pixel defining layer have the lyophobic property.

Figure 8:
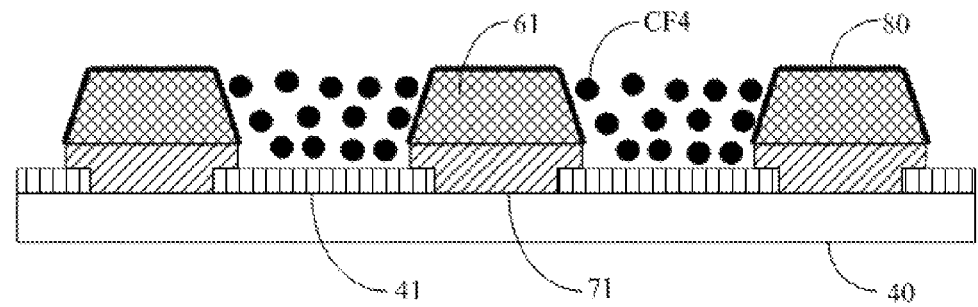

For example, in the embodiment of the present disclosure, the gas used in the fluoridization treatment for the second pixel defining layer is $C_xF_y$ gas, X, Y are integers greater than or equal to 1. For example, in the embodiment of the present disclosure, the gas used in the fluoridization treatment for the second pixel defining layer is $CF_4$ gas, as shown in FIG. 8, while implementing, after the first pixel defining layer film that is exposed is removed by dry etching, by changing $CF_4$ gas and $O_2$ used in the dry etching into $CF_4$ gas, and the surface of the second pixel defining layer is fluoride protected by the $CF_4$ gas, and a replacement reaction takes place between the hydroxy, amino and hydrogen of the organic resin and $CF_4$ gas, so that a fluoride resin layer 80 is formed on the surface of the organic resin, the surface energy of the fluorinated resin layer 80 is sharply reduced, so that the second pixel defining layer 61 has a lyophobic property. In the actual production process, in the case that the fluoride resin is placed too long, the surface characteristics of the resin will be gradually lost, therefore, the fluoride resin should be used in a short period of time. In the actual production process, the fluoride resin for example should be used in half an hour.

Of course, the second pixel defining layer thin film in the embodiment of the present disclosure may be made of a material which is a resin having fluorine, and in this case the second pixel defining layer 61 shown in FIG. 7 has a lyophobic property, and fluoride treatment is not necessary for the second pixel defining layer 61. However, in the case that the second pixel defining layer is made of a material which is a resin having fluorine, in the following process of dry etching, the characteristics of the second pixel defining layer will be affected, so that the lyophobic property of the second pixel defining layer is reduced. At this time, according to the actual situation, the second pixel defining layer 61 can also be subjected to fluoride treatment.

Then, a light emitting layer is manufactured on the substrate having the first pixel defining layer and the second pixel defining layer, the prior art can be used for preparing a light emitting layer, and detailed descriptions will be omitted herein. Then a cathode layer is fabricated on the substrate having a light emitting layer, the prior art can be used for preparing a cathode layer, and detailed descriptions will be omitted herein.

Besides, a hole injection layer and/or a hole transport layer may be manufactured between the anode layer and the light emitting layer in the embodiment of the present disclosure, the prior art can be used for preparing a hole injection layer and/or a hole transport layer, and detailed descriptions will be omitted herein. An electron injection layer and/or an electron transport layer may be manufactured between the light emitting layer and the cathode layer, the prior art can be used for preparing the electron injection layer and/or the electron transport layer, and detailed descriptions will be omitted herein.

In conclusion, embodiments of the present disclosure provides a method for preparing an organic light emitting diode display panel, and the method includes: forming an anode layer, a light-emitting layer and a cathode layer on a substrate, and the method further includes: depositing a first pixel defining layer thin film on the anode layer; depositing a second pixel defining layer thin film on the first pixel defining layer thin film, and forming a second pixel defining layer by patterning the second pixel defining layer thin film through patterning process; and forming a first pixel defining layer through dry etching and removing the first pixel defining layer thin film that is exposed; wherein the first pixel defining layer has a lyophilic property and the second pixel defining layer has a lyophobic property. Only one mask plate is required to be used in the preparation of a double-layer pixel defining layer in the embodiment of the present disclosure, compared with the case that two mask plates are used in the preparation of a double-layer pixel defining layer, one mask plate is reduced in the embodiment of the present disclosure, the production cost is reduced, and the production efficiency is improved.

What are described above is related to the illustrative embodiments of the disclosure only and not limitative to the scope of the disclosure; the scopes of the disclosure are defined by the claims.

The present application claims the priority of the Chinese Patent Application No. 201510181465.6 filed on Apr. 16, 2015, which is incorporated herein by reference as part of the disclosure of the present application.

The invention claimed is:

1. A method for preparing an organic light emitting diode (OLED) display panel, comprising: forming an anode layer, a light-emitting layer and a cathode layer on a substrate, wherein the method further comprises:
   depositing a first pixel defining layer thin film on the anode layer;
   depositing a second pixel defining layer thin film on the first pixel defining layer thin film, and forming a second pixel defining layer by patterning the second pixel defining layer thin film through patterning process; and
   forming a first pixel defining layer through dry etching and removing the first pixel defining layer thin film that is exposed by the second pixel defining layer;
   wherein the first pixel defining layer has a lyophilic property and the second pixel defining layer has a lyophobic property;
   wherein etching gas used in the dry etching is tetrafluoromethane and oxygen;
   wherein after the second pixel defining layer is formed by patterning the second pixel defining layer thin film through patterning process, the first pixel defining layer is formed through dry etching the first pixel defining layer thin film.

2. The method according to claim 1, wherein the second pixel defining layer thin film for forming the second pixel defining layer is made of a material which is a resin having no fluorine, and
   the formed second pixel defining layer is subjected to a fluoridization treatment to make the second pixel defining layer has the lyophobic property.

3. The method according to claim 2, wherein a gas used in the fluoridization treatment for the formed second pixel defining layer is CxFy gas.

4. The method according to claim 3, wherein the gas used in the fluoridization treatment for the formed second pixel defining layer is tetrafluoromethane.

5. The method according to claim 2, wherein the second pixel defining layer thin film for forming the second pixel defining layer is made of a material which is selected from the group consisting of polyimide, acrylic resin or organic silicon.

6. The method according to claim 1, wherein the first pixel defining layer thin film for forming the first pixel defining layer is made of a material which is selected from the group consisting of silicon oxide or silicon nitride.

7. The method according to claim 1, wherein a cross section of the second pixel defining layer is a regular trapezoid.

8. An organic light emitting diode (OLED) display panel prepared by the method of claim 1.

9. A display device, comprising the organic light emitting diode (OLED) display panel according to claim 8.

10. The OLED display panel according to claim 8, wherein the second pixel defining layer thin film for forming the second pixel defining layer is made of a material which is a resin having no fluorine, and
    the formed second pixel defining layer is subjected to a fluoridization treatment to make the second pixel defining layer has the lyophobic property.

11. The OLED display panel according to claim 10, wherein a gas used in the fluoridization treatment for the formed second pixel defining layer is CxFy gas.

12. The OLED display panel according to claim 11, wherein the gas used in the fluoridization treatment for the formed second pixel defining layer is tetrafluoromethane.

13. The OLED display panel according to claim 10, wherein the second pixel defining layer thin film for forming the second pixel defining layer is made of a material which is selected from the group consisting of polyimide, acrylic resin or organic silicon.

14. The OLED display panel according to claim 8, wherein the first pixel defining layer thin film for forming the first pixel defining layer is made of a material which is selected from the group consisting of silicon oxide or silicon nitride.

15. The OLED display panel according to claim 8, wherein a cross section of the second pixel defining layer is a regular trapezoid.

* * * * *